(12) United States Patent
Tsukahara

(10) Patent No.: US 7,411,471 B2
(45) Date of Patent: Aug. 12, 2008

(54) HIGH-FREQUENCY SWITCH

(75) Inventor: Yoshihiro Tsukahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 246 days.

(21) Appl. No.: 11/484,661

(22) Filed: Jul. 12, 2006

(65) Prior Publication Data
US 2007/0171000 A1 Jul. 26, 2007

(30) Foreign Application Priority Data
Jan. 24, 2006 (JP) ............... 2006-015470

(51) Int. Cl.
H01P 1/10 (2006.01)
H01P 5/12 (2006.01)
(52) U.S. Cl. ............... 333/104; 333/32; 333/103
(58) Field of Classification Search ............... 333/32, 333/101, 103, 104
See application file for complete search history.

(56) References Cited
U.S. PATENT DOCUMENTS
7,106,146 B2 * 9/2006 Tsukahara et al. .......... 333/104

2005/0093646 A1 5/2005 Tsukahara et al.
2007/0024389 A1 * 2/2007 Mizutani .................... 333/104

FOREIGN PATENT DOCUMENTS
JP 09-162602 6/1997
JP 2005-136630 5/2005
WO WO 03/032431 4/2003

* cited by examiner

Primary Examiner—Anh Q Tran
(74) Attorney, Agent, or Firm—Leydig, Voit & Mayer, Ltd.

(57) ABSTRACT

A high-frequency switch operating in a millimeter wave band that includes a signal path having a λ/4 transmission path, for part of two or more branch signal paths that branch from an input connection path via a branch point; an FET, which is shunt-connected between a grounding end and the branch signal paths that are positioned between the λ/4 transmission path and a terminal end, as viewed from the branch point, and used to connect or disconnect the branch signal paths and the grounding end; an output matching circuit, which is positioned on the branch signal paths that are positioned between a terminal end and a connection point for the FET as viewed from the branch point, and includes a shunt-connected stub; and a matching FET, which is connected between the stub and the grounding end and used to connect or disconnect the stub and the grounding end in accordance with the FET's connection/disconnection.

6 Claims, 6 Drawing Sheets

HIGH-FREQUENCY SWITCH

BACKGROUND OF THE INVENTION

1. Field of the Invention

The present invention relates to a high-frequency switch, and more particularly to a high-frequency switch that is used to provide RF signal switching for radars and communication apparatuses operating in a millimeter wave band.

2. Description of the Related Art

The application of a microwave device increasingly progresses in accordance with an increase in the degree of computerization. Microwave devices are applied to various fields. For example, there are microwave devices for use in cellular phones, which use a relatively low frequency, microwave devices for use in high-frequency telecommunication, and microwave devices for use in telecommunication equipment such as high-frequency vehicle-mounted radars and observation satellites.

Recently, a small-size, high-speed, high-frequency switch based on a microwave IC (MIC) was developed as a high-speed switch. Further, an MMIC (Monolithic Microwave IC), which is obtained when a connection path and switching element are rendered integral with each other and formed on a semiconductor substrate, is employed so as to raise the speed of the switch and reduce the size of the switch.

The circuit configuration generally employed to form a high-frequency switch that operates in a millimeter wave band is such that the switching element is positioned in parallel with a signal transmission path in order to reduce the transmission loss.

The most basic configuration is an SPDT (Single Pole Double Throw) switch that is formed on a GaAs substrate. The SPDT switch is separated into two branches from an input connection path via a branch point. Each branch is provided with a unit switch. The unit switch is provided with a branch signal path and a switching FET. The switching FET is shunt-connected to the branch signal path.

Each branch signal path includes a $\lambda/4$ ($\lambda$: the wavelength of an employed RF signal band) transmission path, a switching FET, and a switch-ON matching circuit. The $\lambda/4$ transmission path is connected to the branch point closely. The switching FET is shunt-connected via this transmission path to the branch signal path. The switch-ON matching circuit is positioned between a terminal end and a connection point for the switching FET. For example, the matching circuit comprises a transmission path and an open stub.

The switch-ON state is a state in which a signal propagates from an input connection path to a branch signal path output end via a unit switch. In this state, the switching FET for the unit switch is OFF. The switch-OFF state is a state in which the signal from the input connection path is shut off and does not propagate to the branch signal path output end. In this state, the switching FET for the unit switch is ON (conducting). In the following description, the terms "switch-ON" and "switch-OFF" are used to mean the above states respectively.

The SPDT switch configured as described above is such that ON/OFF control is exercised when a predetermined voltage is applied to a gate electrode of the switching FET, and that a switching operation is performed to ensure that the RF signal input from the input connection path is output from the output end of a certain unit switch.

As a well-known conventional high-frequency switch, a 5-branch switch is disclosed, for instance, at paragraphs 0013 and 0014 and FIG. 1 in Japanese Patent Laid-Open No. 2005-136630. The 5-branch switch is such that five branches are provided from an input connection path via a branch point. This switch includes a signal path and an FET. The signal path is such that each branch signal path is partly provided with a $\lambda/4$ transmission path. The FET is shunt-connected to a branch signal path that is positioned between the $\lambda/4$ transmission path and a branch signal path on the output terminal side.

As another well-known example, a single-pole double-throw (SPDT) RF switch is disclosed, for instance, at paragraphs 0011 and 0012 and FIG. 2 in JP-A-2005-515657. In this single-pole double-throw RF switch, a MOSFET transistor 23 is connected between an RF common node 25 and a first RF input node 21, and a MOSFET transistor 24 is positioned between the RF common node 25 and a second input node 22 so that the first RF input node 21 and second input node 22 are selectively coupled to the RF common node 25. Further, a shunt transistor 27 is positioned between the first RF input node 21 and MOSFET transistor 23, and a shunt transistor 28 is positioned between the second input node 22 and MOSFET transistor 24. Shunt transistor 27 and shunt transistor 28 of the single-pole double-throw RF switch work to selectively shunt the associated RF input node to a ground when the associated input nodes are not coupled to the RF common node 25 (that is, when a switching transistor (23 or 24) connected to the associated input nodes is turned OFF).

As still another well-known example, a certain configuration for an SPDT switch is disclosed, for instance, at paragraph 0012, paragraphs 0021 to 0024, FIG. 2, and FIG. 4 in Japanese Patent Laid-Open No. 1997-162602. The SPDT switch includes a common terminal and a pair of branch terminals. The branch terminals are respectively connected to the common terminal via a distributed constant path. A pin diode, FET, or other semiconductor switching element is positioned between either of the branch terminals and a grounding region. The distributed constant path has a characteristic impedance that is determined by multiplying the characteristic impedance of a high-frequency transmission system, to which the common terminal and branch terminals are connected, by the fourth root of two. Further, the distributed constant path has a transmission phase angle of 90 degrees.

In the SPDT switch having a matching circuit including an open stub, the impedance in the frequency band employed for the output node of a unit switch on the switch-ON side matches 50 ohms. However, the impedance for the output node of a unit switch on the switch-OFF side is not 50 ohms.

Therefore, when switching is made, there arises a point at which the impedance is open- or short-circuited so that resonance may occur depending on circumstances within a package containing the switch. If resonance occurs within the package, the operations of a radar or communication apparatus may become faulty. It is therefore necessary to reconfigure the paths and the like in order to avoid resonance within the package. It means that an extra design load increases. To avoid resonance, it is also necessary to increase the spacing interval between the ON and OFF terminals. It means that the cost increases due to a change in the package size.

SUMMARY OF THE INVENTION

The present invention has been made to solve the above problems. It is a first object of the present invention to configure a high-frequency switch so that the characteristic impedance of a connection end on the switch-OFF side is close to the characteristic impedance of a high-frequency transmission system. As a result, the resonance within the package is inhibited at the time of switching so that a low-cost, high-reliability, high-frequency switch can be offered.

According to one aspect of the invention, there is provided a high-frequency switch in a millimeter wave band according to the present invention comprises: a substrate; a signal path located on the substrate, and provided with a common path and two or more branch paths that branch off from the common path via a branch point, each branch path partly provided with a transmission path having a length equivalent to one-fourth the wavelength of a signal propagating through the branch path; a switching element shunt-connected between a grounding end and each of the branch paths, the switching element connected to the branch path at a connection point positioned beyond the transmission path as viewed from the branch point of the signal path connecting or disconnecting electrically the branch path and the grounding end with a first control signal applied to a control electrode of the switching element; a matching circuit connected to the branch path beyond the connection point for the switching element as viewed from the branch point of the signal path, and including a stub shunt-connected to the branch path; and a matching semiconductor element connected between the stub of the matching circuit and the grounding end and the matching semiconductor element connecting or disconnecting the stub and the grounding end with a second control signal applied to a control electrode of the matching semiconductor element in accordance with the switching element's connection/disconnection.

Accordingly, in the high-frequency switch according to the present invention, the matching semiconductor element is ON as the switching element in the branch path on the switch-OFF side is ON. Thus, the ON resistor for the matching semiconductor element is coupled between the grounding end and the stub of the matching circuit. The ON resistor achieves matching with ease so that the characteristic impedance at the connection end on the switch-OFF side is close to the characteristic impedance of the high-frequency transmission system connected to the connection end. Therefore, the reflection loss at the connection end on the switch-OFF side can be reduced. This also makes it possible to inhibit intra-package resonance, which is likely to occur at the time of switching.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

First Embodiment

Figure 1:
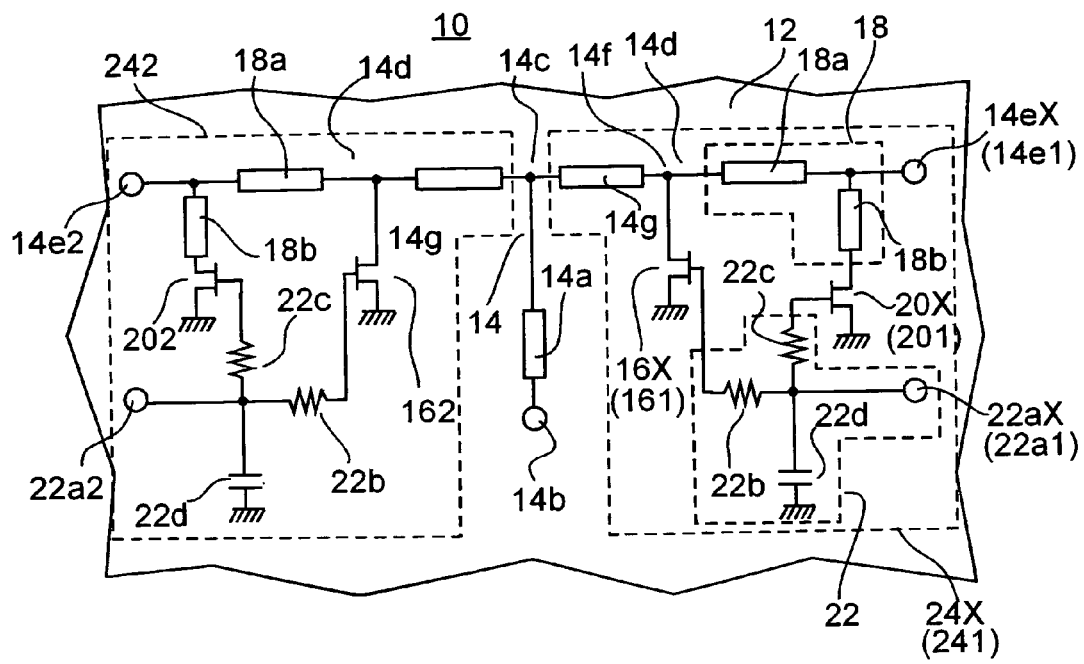
FIG. 1 is a circuit diagram illustrating a high-frequency switch according to an embodiment of the present invention.

FIG. 1 is a circuit diagram illustrating a high-frequency switch according to an embodiment of the present invention.

The high-frequency switch 10, which is shown in FIG. 1, is a two-branch switch operating in, for instance, a 77 GHz band, that is, an SPDT switch. Two unit switches 24X (X=1 or 2) are positioned after a branch point 14$c$ in an input connection path 14$a$, which is a common path. Each unit switch 24X comprises a signal path 14, which includes a λ/4 transmission path 14$g$, an FET 16X (X=1 or 2), an output matching circuit 18, a matching FET 20X (X=1 or 2), and a control circuit 22. Further, various circuit elements are positioned on a GaAs substrate 12 serving as a substrate.

The variable X, which is attached to circuit element reference numerals for the unit switches 24X, varies with the variable X of a unit switch. If, for instance, the reference numeral of a specific unit switch shown in a figure is 241 (that is, when X=1 at 24X), the output end 14$e$X, which constitutes a circuit for that unit switch, is identified by the reference numeral 14$e$1, and the FET 16X is identified by the reference numeral 161. If, on the other hand, the reference numeral of a specific unit switch is 242 (that is, when X=2 at 24X), the output end 14$e$X, which constitutes a circuit for that unit switch, is identified by the reference numeral 14$e$2, and the FET 16X is identified by the reference numeral 162.

The following description assumes that the node of a common path is an input end, and that the node at a terminal end of a branch signal path is an output end. However, the node of a common path may be used as an output end, and the node at a terminal end of a branch signal path is used as an input end.

The signal path 14 comprises, for instance, a microstrip path or other transmission path on the GaAs substrate 12. An input end 14$b$ is positioned in the input connection path 14$a$, which serves as a common path. Branch signal paths 14$d$, which are two branch paths that branch off from the branch point 14$c$ in the signal path 14, are provided. The terminal ends of the branch signal paths 14$d$ are output ends 14$e$X (X=1 or 2). The input end 14b and output ends 14eX are connected to a high-frequency transmission system circuit (not shown) having a predetermined characteristic impedance of, for instance, 50 ohms.

The FET 16X (X=1 or 2), which serves as a switching element, is shunt-connected between the branch signal paths 14d and grounding end via a source electrode and drain electrode. The control voltage applied to the gate electrode for the FET 16X is used to electrically connect or disconnect the branch signal paths 14d and grounding end.

The λ/4 transmission path 14g is connected between the branch point 14c and a connection point 14f at which the FET16X is connected to the branch signal paths 14d. The λ/4 transmission path 14g has a length equivalent to one-fourth the wavelength of an RF signal frequency in the band used by the high-frequency switch 10 (that is, a length of λ/4 when the RF signal wavelength is λ).

The output matching circuit 18 is positioned between the output end 14eX and the connection point 14f for the FET 16X. The output matching circuit 18 is provided with a transmission path 18a, which is series-connected, for instance, to the branch signal paths 14d, and a stub 18b, which is a transmission path that is shunt-connected to the branch signal paths 14d.

The stub 18b is formulated so that when it is an open stub, the impedance at the output end 14eX of a unit switch 24X having the stub 18b matches the characteristic impedance of a high-frequency transmission system circuit.

Further, a matching FET 20X (X=1 or 2), which serves as a matching semiconductor element, is connected between the grounding end and the terminal end of the stub 18b for the output matching circuit 18 via a source electrode and drain electrode. The control voltage applied to the gate electrode of the matching FET 20X electrically connects or disconnects the stub 18b and grounding end.

The matching FET 20X is an FET having a gate width that provides an ON resistor for matching a high-frequency transmission system characteristic impedance of, for instance, 50 ohms when the unit switch 24X containing the matching FET 20X is switched OFF. The resistance setting for the ON resistor of the matching FET 20X approximately ranges from 40 ohms to 80 ohms.

The FET 16X and matching FET 20X are controlled by the control circuit 22. The control circuit 22 is such that a control input end 22aX (X=1 or 2) and the gate electrode of the FET 16X are connected via a resistor 22b, and that a control input end 22aX and the gate electrode of the matching FET 20X are connected via a resistor 22c. In the high-frequency switch 10 according to the first embodiment, resistors 22b and 22c are connected on the side toward the control input end 22aX, and the point of such connection is connected to the grounding end via a capacitor 22d.

Therefore, the common control signal that is input to the control input end 22aX is applied to the gate electrodes for the FET 16X and matching FET 20X so that the FET 16X and matching FET 20X turn ON or OFF identically.

When, in the high-frequency switch 10 configured as described above, an output is to be obtained from the output end 14e1 of unit switch 241, unit switch 241 is switched ON and unit switch 242 is switched OFF.

In this instance, the signal applied to the input end 14b of the input connection path 14a can propagate to the output end 14e1 when a control voltage that turns OFF both the FET 161 and matching FET 201 is applied to the control input end 22a1 of the control circuit 22 for unit switch 241 and a control voltage that turns ON both the FET 162 and matching FET 202 is applied to the control input end 22a2 of the control circuit 22 for unit switch 242.

Figure 2:
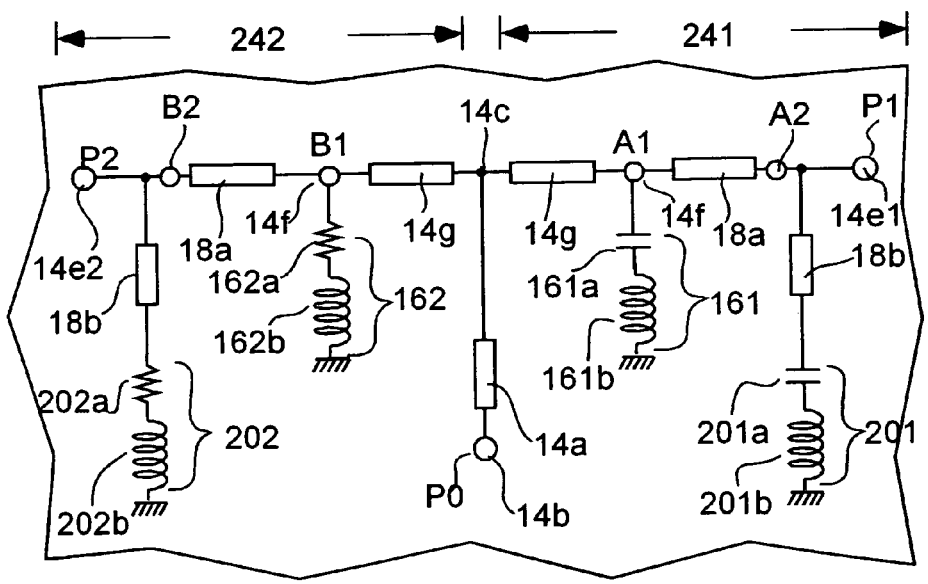
FIG. 2 is a schematic diagram illustrating an equivalent circuit that prevails while the high-frequency switch according to one embodiment of the present is operating.

FIG. 2 is a schematic diagram illustrating an equivalent circuit that prevails while the high-frequency switch according to the present embodiment is operating. The equivalent circuit shown in FIG. 2 prevails while unit switch 241 is switched ON and unit switch 242 is switched OFF.

In other words, the FET 161 for unit switch 241 is OFF and equivalent to a series connection between a capacitor 161a having a capacitance of Coff1 and an inductor 161b. The matching FET 201 for unit switch 241 is also OFF and equivalent to a series connection between a capacitor 201a having a capacitance of Coff2 and an inductor 201b.

On the other hand, the FET 162 for unit switch 242 is ON and equivalent to a series connection between a resistor 162a having an ON resistance of ROn1 and an inductor 162b. The matching FET 202 for unit switch 242 is also ON and equivalent to a series connection between a resistor 202a having an ON resistance of ROn2 and an inductor 202b.

The present embodiment is set so that the gate width of the matching FET 20X for the unit switch 24X is smaller than that of the FET 16X. Therefore, the ON resistance of the FET 16X is smaller than that of the matching FET 20X, and the OFF state capacitance of the FET 16X is greater than that of the matching FET 20X. In other words, ROn1 <ROn2 and Coff1> Coff2 in the equivalent circuit shown in FIG. 2.

Figure 3:
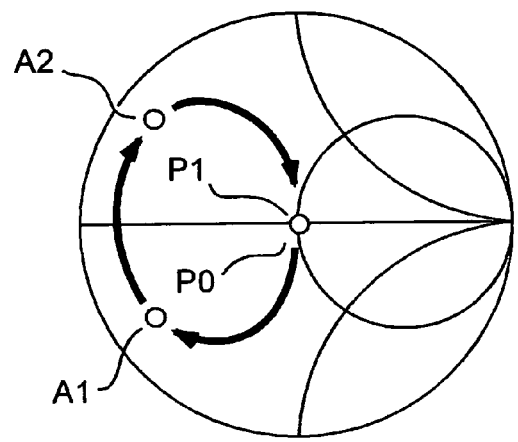
FIG. 3 is a Smith chart illustrating the impedance and locus of each node on the switch-ON side of the high-frequency switch according to one embodiment of the present invention.

FIG. 3 is a Smith chart illustrating the impedance and locus of each node on the switch-ON side of the high-frequency switch according to the present embodiment.

In FIG. 3, node P0 corresponds to the input end 14b; node A1 for the unit switch 241 on the switch-ON side corresponds to the connection point 14f at which the FET 161 is connected to the branch signal paths 14d; node A2 corresponds to a point between the end on the side toward the output end 14e1 of the transmission path 18a and the connection point at which the stub 18b is connected to the branch signal paths 14d; and node P1 corresponds to the output end 14e1.

In FIG. 3, the impedance locus of unit switch 241 on the switch-ON side starts at node P0, which is 50 ohms, and node P1 reverts to a resistance of 50 ohms or so via nodes A1 and A2. The reason is that a resistance of 50 ohms is matched in the ON state when the stub 18b is formed as an open stub. Therefore, even when the matching FET 201 is positioned at the leading end of the stub 18b, node P1 reverts to a resistance of 50 ohms or so.

Figure 4:
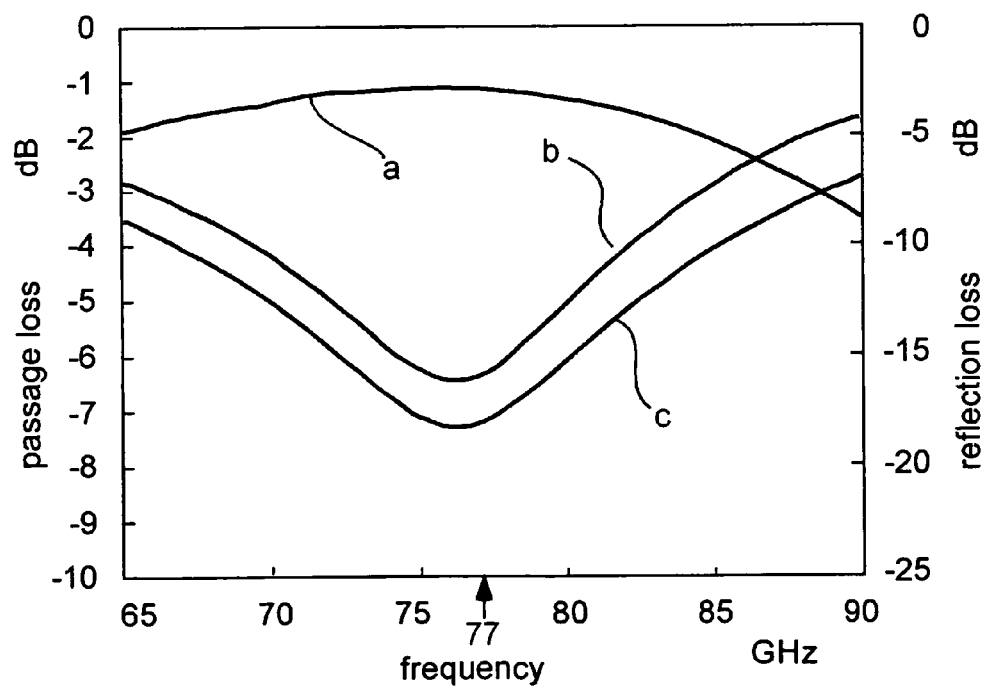
FIG. 4 is a graph that shows the RF characteristic calculation results concerning the switch-ON side of the high-frequency switch according to one embodiment of the present invention.

FIG. 4 is a graph that shows the RF characteristic calculation results concerning the switch-ON side of the high-frequency switch according to the present embodiment.

In FIG. 4, curve a indicates a passage loss; curve b, a reflection characteristic at node P1, that is, at the output end 14e1; curve c, a reflection loss at node P0, that is, at the input end 14b.

The OFF state capacitance of the FET 161 is greater than that of the matching FET 201. It means that Coff1>Coff2. Since the passage loss is virtually determined by Coff1, no significant influence is exerted when Coff2, which is smaller than Coff1, is added. Therefore, the curves indicating the RF characteristic of the switch-ON side do not virtually differ from a situation where the matching FET 201 is not provided.

When the values obtained at 77 GHz are compared, the passage loss is −1.2 dB, the reflection characteristic at the output end 14e1 is −16 dB, and the reflection loss at the input end 14b is −18 dB no matter whether the matching FET 201 is provided.

Figure 5:
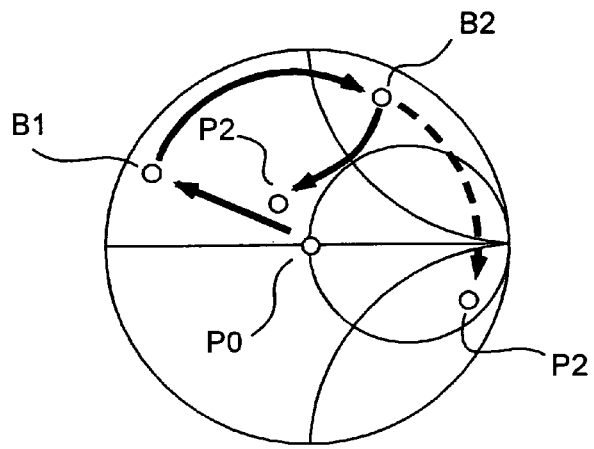
FIG. 5 is a Smith chart illustrating the impedance and locus of each node on the switch-OFF side of the high-frequency switch according to one embodiment of the present invention.

FIG. 5 is a Smith chart illustrating the impedance and locus of each node on the switch-OFF side of the high-frequency switch according to the present embodiment.

In FIG. 5, node P0 corresponds to the input end 14b; node B1 for the unit switch 142 on the switch-OFF side corresponds to the connection point 14f at which the FET 162 is connected to the branch signal paths 14d; node B2 corresponds to a point between the end on the side toward the output end 14e2 of the transmission path 18a and the connection point at which the stub 18b is connected to the branch signal paths 14d; and node P2 corresponds to the output end 14e2.

In FIG. 5, the impedance locus of unit switch 242 on the switch-OFF side starts at node P0, which is 50 ohms, and moves to node P2 via nodes B1 and B2. If the matching FET 202 is not provided, the impedance moves to node P2, which is significantly displaced from a resistance of 50 ohms, via the locus indicated by a broken line.

However, when the matching FET 202 is furnished between the end of the stub 18b and the grounding end, the ON resistor 202a having an ON resistance of ROn2 is inserted. Therefore, when the value of a resistance of ROn2 is adjusted, the impedance can return to node P2, which is close to a resistance of 50 ohms, via the locus indicated by a solid line.

Figure 6:
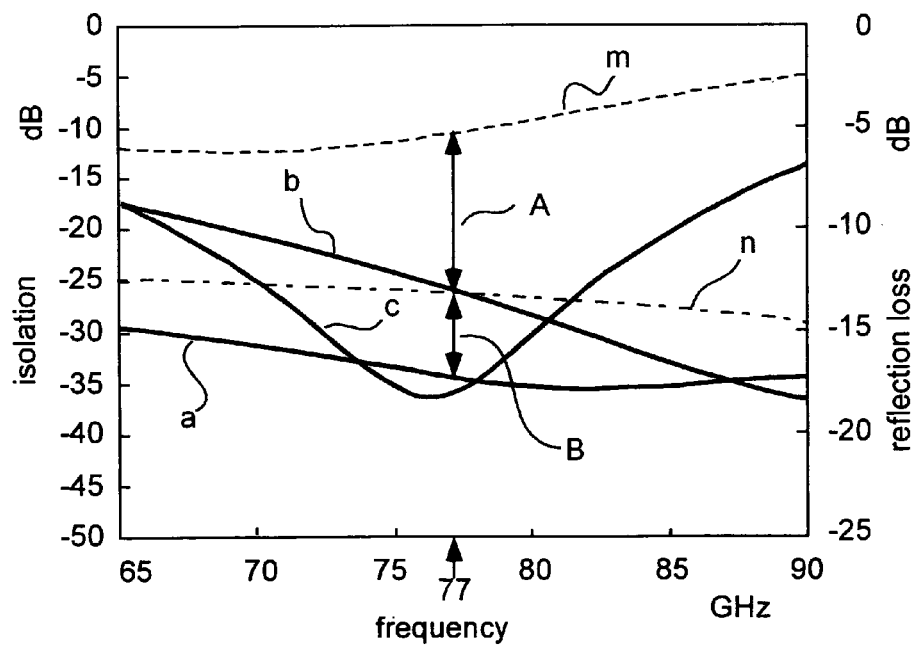
FIG. 6 is a graph that shows the RF characteristic calculation results concerning the switch-OFF side of the high-frequency switch according to one embodiment of the present invention.

FIG. 6 is a graph that shows the RF characteristic calculation results concerning the switch-OFF side of the high-frequency switch according to the present embodiment.

In FIG. 6, curve a indicates an isolation between the input end 14b and the output end 14e2 on the switch-OFF side; curve b, a reflection characteristic at node P2, that is, at the output end 14e2 on the switch-OFF side; curve c, a reflection loss at node P0, that is, at the input end 14b.

Further, curves m and n are shown for comparison purposes. Curve m indicates a reflection characteristic that prevails at node P2, that is, at the output end 14e2 on the switch-OFF side when the matching FET 202 is not provided. Curve n indicates an isolation between the input end 14b and the output end 14e2 on the switch-OFF side that prevails when the matching FET 202 is not provided.

Arrow A indicates the value difference between curves m and b at 77 GHz. Arrow B indicates the value difference between curves n and a. The value of curve m at 77 GHz is −5 dB. The value of curve b at 77 GHz is −13 dB. Therefore, when the matching FET 202 is provided, the reflection loss at the output end 14e2 on the switch-OFF side is reduced by 8 dB.

When the reflection characteristic in the switch-OFF state is improved as described above, resonance is not likely to occur in a package containing the circuit configuration for the high-frequency switch 10 due to a drastic impedance change at the time of switching.

Consequently, high reliability results. Further, the redesign and other design loads for resonance avoidance decrease, thereby preventing the cost from increasing.

In FIG. 6, the value of curve n at 77 GHz is −26 dB and the value of curve a at 77 GHz is −34 dB. Therefore, when the matching FET 202 is provided, the isolation between the input end 14b and the output end 14e2 on the switch-OFF side is improved by 8 dB.

First Modified Embodiment

The configuration of a high-frequency switch according to a first modified embodiment is basically the same as that of the high-frequency switch 10 according to the first embodiment. In the high-frequency switch according to the first modified embodiment, the semiconductor element which is used as switching element and matching semiconductor element are connected to separate control input ends. The control voltage for the matching semiconductor element is separated from the semiconductor element, which is used as a switching element. The control voltage can be applied as desired so that the ON voltage of the matching semiconductor element is adjustable.

Figure 7:
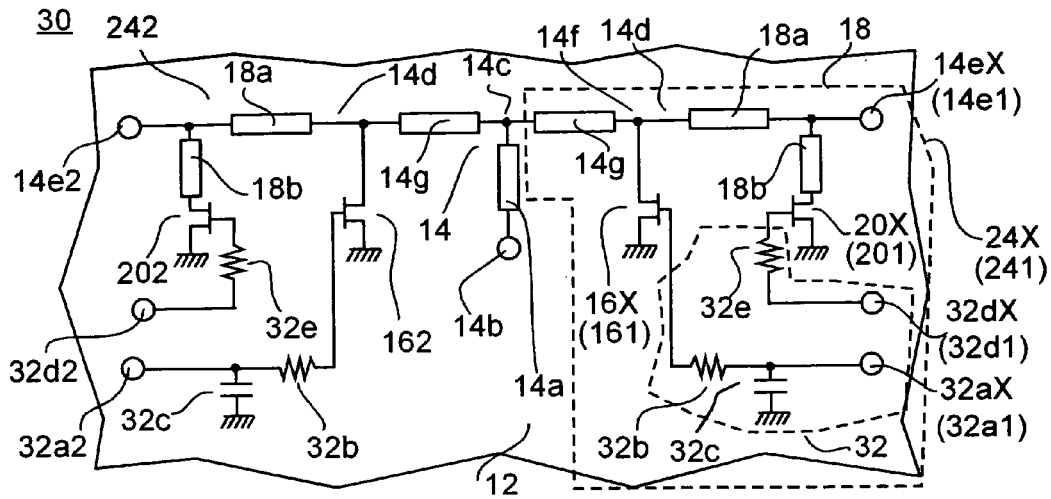
FIG. 7 is a circuit diagram illustrating the first modified embodiment of a high-frequency switch according to one embodiment of the present invention.

FIG. 7 is a circuit diagram illustrating the first modified embodiment of a high-frequency switch according to one embodiment of the present invention.

In FIG. 7, the high-frequency switch 30 has the same basic configuration as the high-frequency switch 10 according to the first embodiment. However, the first modified embodiment differs from the first embodiment in the control circuit that controls the FET 16X, which serves as a switching element, and the matching FET 20X, which serves as a matching semiconductor element.

In the control circuit 22 for the high-frequency switch 10 according to the first embodiment, the control input end 22aX and the gate electrode for the FET 16X are connected via resistor 22b, and the control input end 22aX and the gate electrode for the matching FET 20X are connected via resistor 22c. Resistors 22b and 22c are connected on the side toward the control input end 22aX. Therefore, the FET 16X and matching FET 20X are controlled by a single control signal.

In the control circuit 32 for the high-frequency switch 30 according to the first modified embodiment, on the other hand, the control input end 32aX and the gate electrode for the FET 16X are connected via resistor 32b, and a capacitor 32c, which is between the control input end 32aX and resistor 32b, is shunt-connected to a grounding end.

Meanwhile, control input end 32dX is provided independently of control input end 32aX. Control input end 32dX and the gate electrode for the matching FET 20X are connected via resistor 32e.

Therefore, each unit switch 24X comprises the signal path 14, which includes the λ/4 transmission path 14g; the FET 16X; the output matching circuit 18; the matching FET 20X; and the control circuit 32.

In the configuration described above, the control signal for the matching FET 20X can be applied independently of the control signal for controlling the switching operation of the FET 16X. The FET can change the ON resistor in accordance with the voltage applied to the gate.

Therefore, the high-frequency switch 30 according to the first modified embodiment not only provides the advantages offered by the high-frequency switch 10 according to the first embodiment, but also makes it possible to fine tune the impedance of the output end 14e2 on the switch-OFF side, that is, the impedance of node P2, which is shown in FIG. 2, by adjusting the control voltage of the control input end 32d2 and varying the voltage applied to the gate electrode of the matching FET 202.

If resonance occurs in a package containing the circuit configuration for the high-frequency switch 30 according to the first modified embodiment, intra-package resonance can be inhibited by adjusting the control voltage of the control input end 32d2 at the time of switching OFF.

Figure 8:
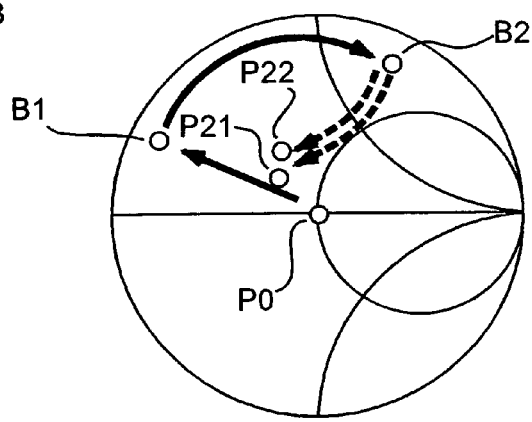
FIG. 8 is a Smith chart illustrating the impedance and locus of each node on the switch-OFF side of the high-frequency switch according to one modified embodiment of the present invention.

FIG. 8 is a Smith chart illustrating the impedance and locus of each node on the switch-OFF side of the high-frequency switch according to one modified embodiment of the present invention.

In FIG. 8, the impedance locus of unit switch 242 on the switch-OFF side starts at node P0, which is 50 ohms, and moves to node P2 via nodes B1 and B2. In this instance, when the control voltage of the control input end 32d2 is adjusted to vary the voltage applied to the gate electrode of the matching FET 202, the impedance of node P2 can be fine tuned to P21 or P22.

Second Modified Embodiment

The high-frequency switch according to a second modified embodiment has basically the same configuration as the high-frequency switch 30 according to the first modified embodiment. However, the high-frequency according to the second modified embodiment uses diodes as the switching element and matching semiconductor element instead of FETs. The other circuit configuration changes are made due to the use of such diodes.

Figure 9:
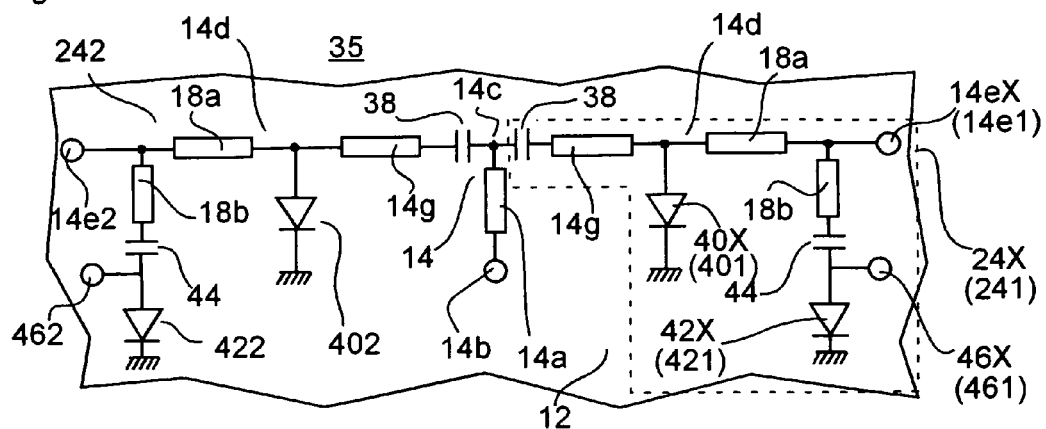
FIG. 9 is a circuit diagram illustrating a high-frequency switch according to one modified embodiment of the present invention.

FIG. 9 is a circuit diagram illustrating a high-frequency switch according to one modified embodiment of the present invention.

As indicated in FIG. 9, the high-frequency switch 35 according to the second modified embodiment differs in configuration from the high-frequency switch 30 according to the first modified embodiment in that a direct-current-interrupting capacitor 38 is positioned between the branch point 14c and λ/4 transmission path 14g. A diode 40X (X=1 or 2) is used in place of the FET 16X. A shunt connection is established between the branch signal paths 14d and grounding end by connecting an anode to a branch path and connecting a cathode to the grounding end. Further, a matching diode 42X (X=1 or 2) is used in place of the matching FET 20X. The matching diode 42X is connected to the stub 18b via the direct-current-interrupting capacitor 44, and connected between the stub 18b and grounding end with the cathode positioned toward the grounding end.

Short-circuiting and disconnection between the diode 40X and grounding end are controlled by applying a predetermined voltage from the output end 14eX. Short-circuiting and disconnection between the matching diode 42X and grounding end are controlled by applying a predetermined voltage from the control input end 46X, which is positioned between the anode of the matching diode 42X and the capacitor 44.

Therefore, each unit switch 24X comprises the signal path 14, which includes the λ/4 transmission path 14g; the capacitor 38; the diode 40X, the output matching circuit 18; the matching diode 42X; and the control input end 46X.

When the above configuration is used to set an appropriate ON resistance for the matching diode 42X, the impedance of the output end 14e2 on the switch-OFF side can be adjusted until it is close to an impedance of approximately 50 ohms or other predetermined characteristic impedance of the high-frequency transmission system. Consequently, the high-frequency switch 35 according to the second modified embodiment provides the same advantages as high-frequency switch 10 and high-frequency switch 30.

The same advantages are provided even when a Schottky barrier diode or PIN diode is used instead of a regular diode.

The foregoing description relates to an SPDS switch that has two unit switches. However, the same advantages are also provided when the number of unit switches is increased.

Further, the foregoing description relates to a case where circuit elements constituting a high-frequency circuit device are mounted on a GaAs substrate. However, such circuit elements may alternatively be mounted on a dielectric substrate instead of a GaAs substrate. Furthermore, the high-frequency switch need not always be mounted on a single, common substrate. The high-frequency switch according to the present embodiment is such that an FET and diode, which serve as matching semiconductor elements, are inserted between the grounding end and the leading end of the stub 18b, which is set so that the output end impedance matches a predetermined characteristic impedance of the high-frequency transmission system at the time of switching ON. The FET and diode that serve as the matching semiconductor elements are turned ON at the time of switching OFF, that is, when the FET and diode that serve as the switching elements are turned ON. The resulting ON resistance is then used to make adjustments so that the output end impedance on the switch-OFF side is close to the predetermined characteristic impedance of the high-frequency transmission system. This makes it possible to reduce the reflection loss at an output node on the switch-OFF side. Further, intra-package resonance is inhibited although it is likely to occur at the time of switching. Furthermore, a configuration can be created so that appropriate measures can be taken even when resonance occurs within the package.

Moreover, it is possible to provide improved isolation between the input end and the output end on the switch-OFF side.

As described above, the high-frequency switch according to the present invention comprises a substrate; a signal path located on the substrate, and provided with a common path and two or more branch paths that branch off from the common path via a branch point, each branch path partly provided with a transmission path having a length equivalent to one-fourth the wavelength of a signal propagating through the branch path; a switching element shunt-connected between a grounding end and each of the branch paths, the switching element connected to the branch path at a connection point positioned beyond the transmission path as viewed from the branch point of the signal path connecting or disconnecting electrically the branch path and the grounding end with a first control signal applied to a control electrode of the switching element; a matching circuit connected to the branch path beyond the connection point for the switching element as viewed from the branch point of the signal path, and including a stub shunt-connected to the branch path; and a matching semiconductor element connected between the stub of the matching circuit and the grounding end and the matching semiconductor element connecting or disconnecting the stub and the grounding end with a second control signal applied to a control electrode of the matching semiconductor element in accordance with the switching element's connection/disconnection. Due to the use of the above configuration, the matching semiconductor element is ON as the switching element in the branch path on the switch-OFF side is ON. Thus, the ON resistor for the matching semiconductor element is coupled between the grounding end and the stub of the matching circuit. The ON resistor achieves matching with ease so that the characteristic impedance at the connection end on the switch-OFF side is close to the characteristic impedance of the high-frequency transmission system connected to the connection end. Therefore, the reflection loss at the connection end on the switch-OFF side can be reduced. This also makes it possible to inhibit intra-package resonance, which is likely to occur at the time of switching.

Further, the control electrode for the switching element and the control electrode for the matching semiconductor element are electrically separated from each other so that the first and second control signals can be individually applied to the respective control electrodes. This makes it possible to adjust the ON resistance of the matching semiconductor element independently of the switching element. Consequently, the impedance at the output end on the switch-OFF side can be fine tuned.

Second Embodiment

In a second embodiment of the present invention, the high-frequency switch configured in accordance with the first embodiment is mounted on a single GaAs substrate, and the input end, output end, and control input end are provided each with a terminal to formulate a switch MMIC.

Figure 10:
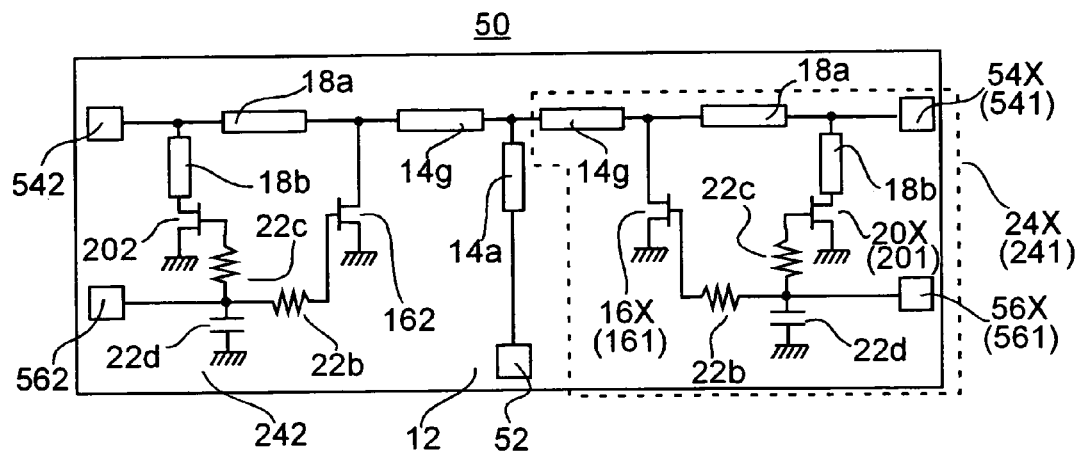
FIG. 10 is a circuit diagram illustrating the switch MMIC according to one embodiment of the present invention.

FIG. 10 is a circuit diagram illustrating the switch MMIC according to one embodiment of the present invention.

The switch MMIC 50 shown in FIG. 10 has the same circuit configuration as the high-frequency switch 10 according to the first embodiment. Various elements, which constitute circuit elements, are formed on a single GaAs substrate 12, which serves as a semiconductor substrate. An input terminal 52 is provided for the input end 14b of the input connection path 14a. An output terminal 54X (X=1 or 2) is provided for the output end 14eX of the unit switch 24X. A control input terminal 56X (X=1 or 2) is provided for the control input end 22aX. These terminals are positioned on the periphery of the GaAs substrate 12. In the other respects, the configuration of the switch MMIC 50 is the same as that of the high-frequency switch 10.

When the switch MMIC 50 is formed by configuring various circuit elements in an integral manner, it is easy to manufacture the switch MMIC 50 as a switch element. In addition, the switch MMIC can be effectively made smaller in size to reduce the package size and cost.

Figure 11:
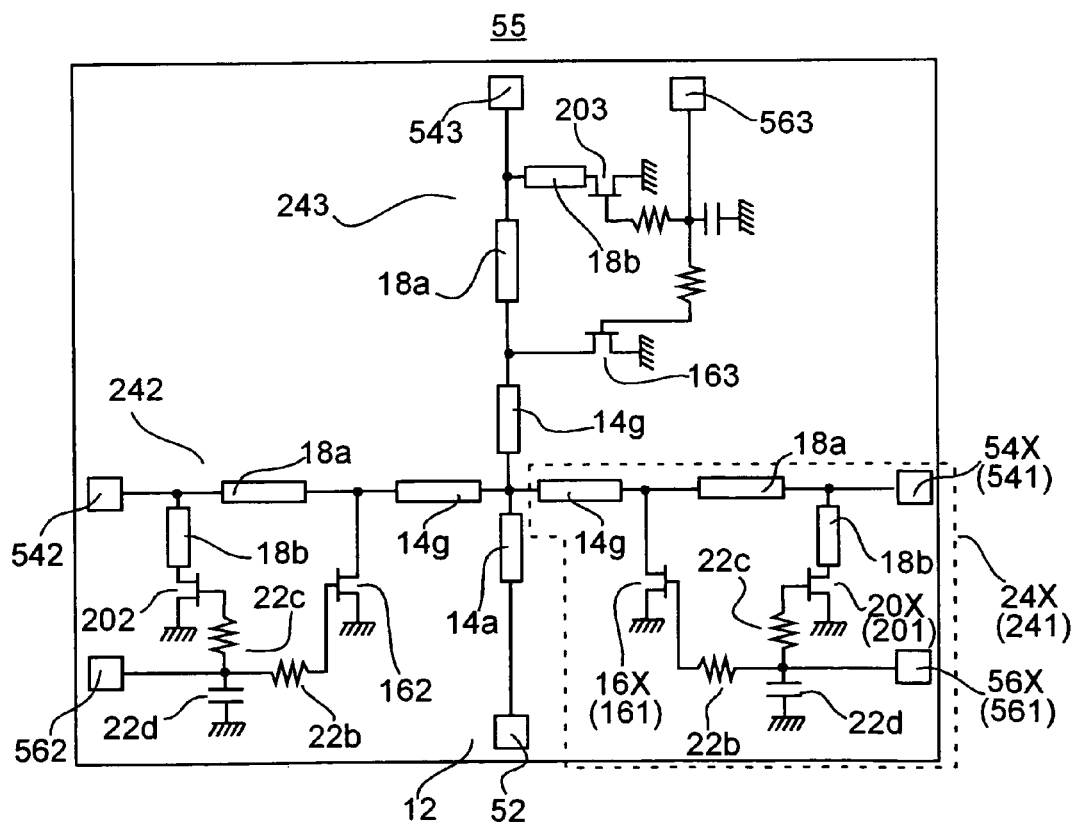
FIG. 11 is a circuit diagram illustrating the switch MMIC according to one embodiment of the present invention.

FIG. 11 is a circuit diagram illustrating the switch MMIC according to one embodiment of the present invention.

As indicated in FIG. 11, switch MMIC 55 includes three unit switches 24X (X=1, 2, or 3). The three unit switches 24X are positioned after a branch point 14c in the input connection path 14a, which is a common path. More specifically, unit switches 241, 242, and 243 are positioned 90 degrees apart from each other. These unit switches 24X have the same configuration as the unit switches 24X for switch MMIC 50.

In accordance with the number of unit switches, the output terminals 54X (X=1, 2, or 3) and control input terminals 56X (X=1, 2, or 3) are provided. More specifically, output terminals 541, 542, and 543 and control input terminals 561, 562, and 563 are provided.

Figure 12:
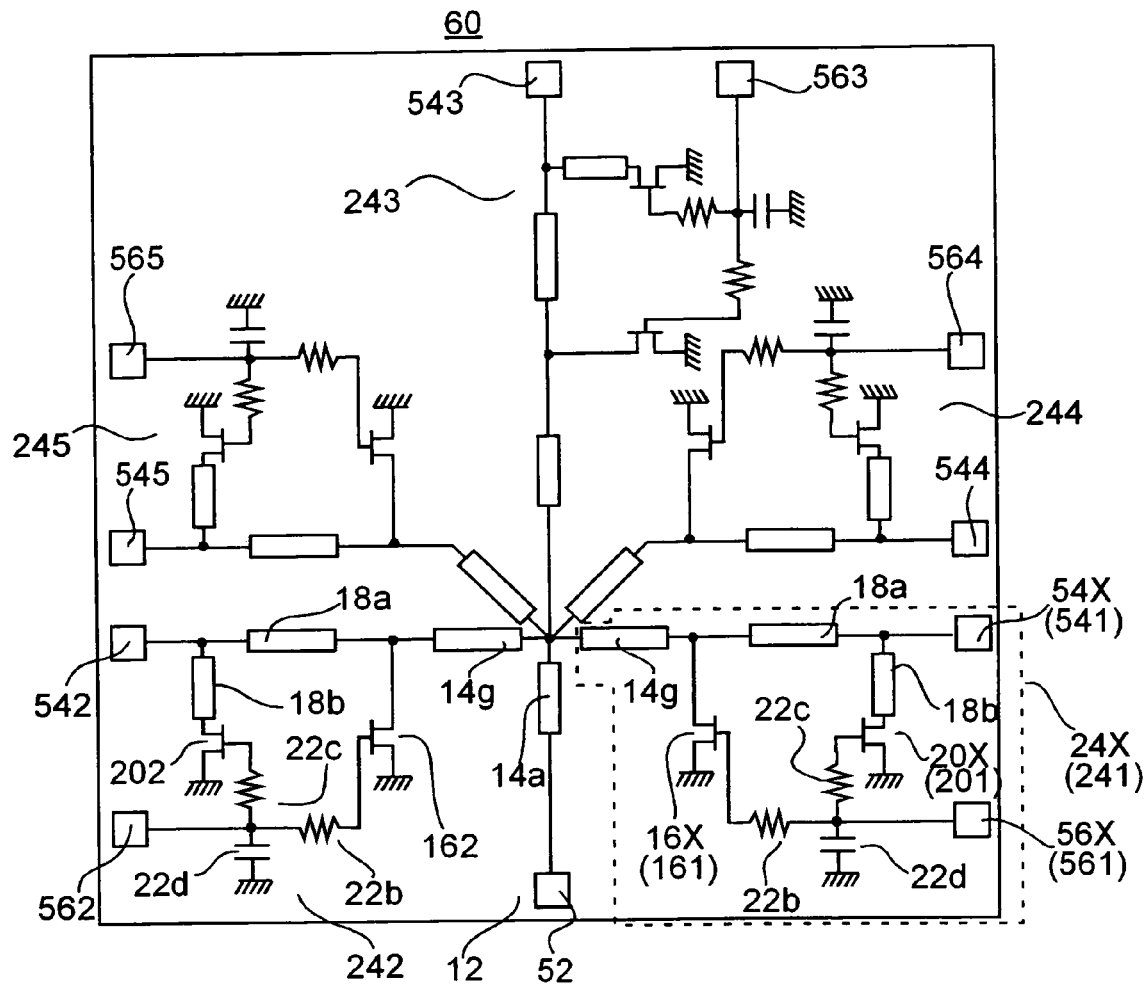
FIG. 12 is a circuit diagram illustrating the switch MMIC according to one embodiment of the present invention.

FIG. 12 is a circuit diagram illustrating the switch MMIC according to one embodiment of the present invention.

As indicated in FIG. 12, switch MMIC 60 includes five unit switches 24X (X=1, 2, 3, 4, or 5). The five unit switches 24X are positioned after the branch point 14c in the input connection path 14a, which is a common path. More specifically, unit switches 241, 242, 243, 244, and 245 are provided. These unit switches 24X have the same configuration as the unit switches 24X for switch MMIC 50.

In accordance with the number of unit switches, the output terminals 54X (X=1, 2, 3, 4, or 5) and control input terminals 56X (X=1, 2, 3, 4, or 5) are provided.

If an n-branch switch providing four or more branches is to be mounted on a GaAs substrate to form an MMIC, that is, if n≧4, at least two RF terminals are positioned at a chip periphery on the same side of the GaAs substrate. In the case of switch MMIC 60, for instance, output terminals 541 and 544 are positioned adjacent to each other at the same periphery of the GaAs substrate constituting a chip, and output terminals 542 and 545 are positioned adjacent to each other at the same periphery of the GaAs substrate 12 constituting a chip. Therefore, the isolation between these terminals needs to be considered.

Figure 13:
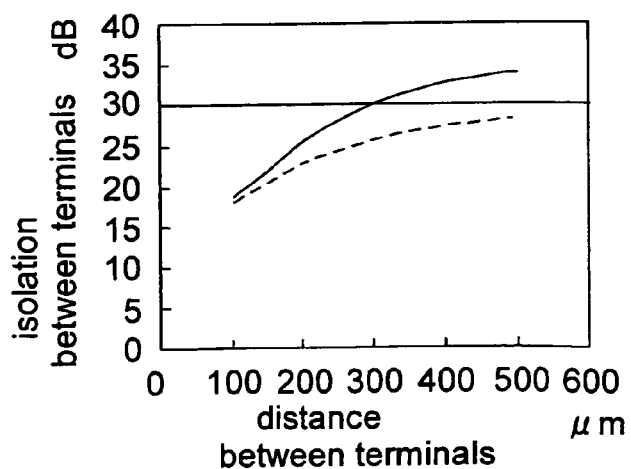
FIG. 13 is a graph illustrating an isolation characteristic that prevails between the RF terminals of an SP5D switch according to the present invention.

FIG. 13 is a graph illustrating an isolation characteristic that prevails between the RF terminals of an SP5D switch according to the present invention.

In FIG. 13, curve a relates to output terminals 541 and 544, which are the RF terminals of switch MMIC 60, and represents the results of calculations of the relationship between the isolation and the distance between the RF signal output terminals at, for instance, 77 GHz. For comparison purposes, curve b is shown in a broken line. Curve b relates to output terminals 541 and 544 in a situation where the matching FET 20X is removed from a unit switch for switch MMIC 60, and represents the results of calculations of the relationship between the isolation and the distance between the RF signal output terminals at 77 GHz.

When a 77 GHz RF signal is used with a conventional type that does not have the matching FET 20X, a 500 μm or greater interval needs to be provided in order to obtain a 30 dB or greater inter-terminal isolation. However, if switch MMIC 60 is used, a 30 dB isolation is obtained when the inter-terminal interval is 300 μm. Therefore, when switch MMIC 60 is used, the MMIC chip size can be reduced.

Although the description of the second embodiment assumes that the employed configuration includes the unit switches for the high-frequency switch 10 according to the first embodiment, the same advantages can also be provided even when the unit switches included in the other configurations described in conjunction with the first embodiment are used.

The high-frequency switch according to the present embodiment form various elements, which constitute circuit elements, on a single GaAs substrate 12, which serves as a semiconductor substrate. Further, the high-frequency switch provides the input end 14b of the input connection path 14a with the input terminal 52, provides the output end 14eX of the unit switch 24X with the output terminal 54X, and provides the control input end 22aX with the control input terminal 56X. These terminals are positioned on the periphery of the GaAs substrate 12. The high-frequency switch is integrated as an MMIC switch. Further, the isolation between the output terminals improves. Therefore, the chip size can be reduced. In addition, a low-cost, high-reliability, high-frequency switch can be configured.

As described above, the high-frequency switch according to the present invention is such that the substrate on which a signal path is located is a semiconductor substrate, and that a switching element, output matching circuit, and matching semiconductor element are located on the semiconductor substrate. The high-frequency switch is formed in an integral manner on the semiconductor substrate. Further, the isolation between the output terminals improves. Therefore, the chip size can be reduced. In addition, a low-cost, high-reliability, high-frequency switch can be configured.

As described above, the high-frequency switch according to the present invention is suitable as a high-frequency switch that provides RF signal switching for radars and communication apparatuses operating in a millimeter wave band.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A switch operating in a millimeter wave band comprising:
    a substrate;
    a signal path located on the substrate, and including a common path and two or more branch paths that branch from the common path via a branch point, each branch path partly including a transmission path having a length equivalent to one-fourth wavelength of a signal propagating through the branch path;

a switching element shunt-connected between a grounding end and each of the branch paths, the switching element being connected to the branch path at a connection point positioned beyond the transmission path, as viewed from the branch point of the signal path, connecting and disconnecting electrically the branch path and the grounding end in response to a first control signal applied to a control electrode of the switching element;

a matching circuit connected to the branch path beyond the connection point for the switching element, as viewed from the branch point of the signal path, and including a stub shunt-connected to the branch path; and a matching semiconductor element connected between the stub of the matching circuit and the grounding end, the matching semiconductor element connecting and disconnecting the stub and the grounding end in response to a second control signal applied to a control electrode of the matching semiconductor element in accordance with the connection or disconnection of the branch path and the grounding end by the switching element.

2. The switch according to claim 1, wherein the control electrode of the switching element and the control electrode of the matching semiconductor element are electrically connected so that the first control signal and the second control signal are identical.

3. The switch according to claim 1, wherein the control electrode of the switching element and the control electrode of the matching semiconductor element are electrically separated from each other so that the first control signal and the second control signal can be separately applied to the respective control electrodes.

4. The switch according to claim 1, wherein the switching element and the matching semiconductor element reflected from the group consisting of field-effect transistors and diodes.

5. The switch according to claim 4, wherein
the switching element and the matching semiconductor element are both field-effect transistors, and
the matching semiconductor element has a smaller gate width than the switching element.

6. The switch according to claim 1, wherein
the substrate on which the signal path is located is a semiconductor substrate, and
the switching element, the matching circuit, and the matching semiconductor element are located on the semiconductor substrate.

* * * * *